US007932782B2

(12) United States Patent
Lau et al.

(10) Patent No.: US 7,932,782 B2
(45) Date of Patent: Apr. 26, 2011

(54) AVERAGE POWER EFFICIENCY ENHANCEMENT AND LINEARITY IMPROVEMENT OF MICROWAVE POWER AMPLIFIERS

(75) Inventors: Kwok Wai Lau, Kowloon (HK); Quan Xue, Kowloon (HK); Wing Shing Chan, Kowloon (HK); Chi Hou Chan, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 11/953,656

(22) Filed: Dec. 10, 2007

(65) Prior Publication Data

US 2009/0146740 A1 Jun. 11, 2009

(51) Int. Cl.
*H03F 3/04* (2006.01)

(52) U.S. Cl. ........................................ 330/296; 330/285

(58) Field of Classification Search .................. 330/285, 330/296, 302
See application file for complete search history.

(56) References Cited

U.S. PATENT DOCUMENTS

| | | | | |
|---|---|---|---|---|
| 5,089,790 | A * | 2/1992 | Mochizuki et al. | 330/277 |
| 6,215,359 | B1 * | 4/2001 | Peckham et al. | 330/302 |
| 6,744,321 | B2 * | 6/2004 | Noh et al. | 330/296 |
| 7,005,923 | B2 | 2/2006 | Noh et al. | 330/285 |
| 2005/0083128 | A1 | 4/2005 | Chan et al. | |
| 2005/0264365 | A1 | 12/2005 | Takahashi | |
| 2006/0114066 | A1 | 6/2006 | Oka | 330/302 |

FOREIGN PATENT DOCUMENTS

| | | | |
|---|---|---|---|
| CN | 1400742 | A | 3/2003 |

OTHER PUBLICATIONS

Written Opinion of the International Searching Authority for corresponding International Patent Application No. PCT/CN2008/000635 completed on Sep. 9, 2008.

International Search Report for corresponding International Patent Application No. PCT/CN2008/000635 completed on May 8, 2008 and mailed on Sep. 18, 2008.

de Carvalho, et al., "Large- and Small-Signal IMD Behavior of Microwave Power Amplifiers," IEEE Transactions on Microwave Theory and Techniques, Dec. 1999, pp. 2364-2374, vol. 47, No. 12.

Yamauchi, et al., "A Microwave Miniaturized Linearizer Using a Parallel Diode with a Bias Feed Resistance," IEEE Transactions on Microwave Theory and Techniques, Dec. 1997, pp. 2431-2435, vol. 45, No. 12.

(Continued)

*Primary Examiner* — Robert Pascal
*Assistant Examiner* — Khiem D Nguyen
(74) *Attorney, Agent, or Firm* — Hesin Rothenberg Farley & Mesiti P.C.

(57) ABSTRACT

A biasing circuit is used to provide low distortion and high efficiency operation of a microwave power amplifier. The biasing circuit utilizes the nonlinear rectified current of a microwave diode or transistor for biasing the amplifying transistor self-adaptively. The biasing current not only reduces the DC bias power during low-power operation and increases self-adaptively during high-power operation, but also manipulates the intermodulation distortion minimum dynamically. Meanwhile, the biasing circuit distorts the input signals with positive gain and negative phase deviations. Therefore, the average power efficiency of the operation is enhanced, the linearity of the input-output characteristic is improved and the radiated level of adjacent channel power is suppressed.

19 Claims, 7 Drawing Sheets

OTHER PUBLICATIONS

Yoshimasu, et al., "An HBT MMIC Power Amplifier with an Integrated Diode Linearizer for Low-Voltage Portable Phone Applications," IEEE Journal of Solid-State Circuits, Sep. 1998, pp. 1290-1296, vol. 33, No. 9.

Yamanouchi, et al., "Analysis and Design of a Dynamic Predistorter for WCDMA Handset Power Amplifiers," IEEE Transactions on Microwave Theory and Techniques, Mar. 2007, pp. 493-503, vol. 55, No. 3.

Noh, et al., "PCS/W-CDMA Dual-Band MMIC Power Amplifier With a Newly Proposed Linearizing Bias Circuit," IEEE Journal of Solid-State Circuits, Sep. 2002, pp. 1096-1099, vol. 37, No. 9.

Yu, et al., "1.9 GHz low loss varactor diode pre-distorter," Electronics Letters, Sep. 30, 1999, pp. 1681-1682, vol. 35, No. 20.

Yum, et al., "High-Efficiency Linear RF Amplifier—A Unified Circuit Approach to Achieving Compactness and Low Distortion," IEEE Transactions on Microwave Theory and Techniques, Aug. 2006, pp. 3255-3266, vol. 54, No. 8.

* cited by examiner

AVERAGE POWER EFFICIENCY ENHANCEMENT AND LINEARITY IMPROVEMENT OF MICROWAVE POWER AMPLIFIERS

FIELD OF THE INVENTION

This invention relates to a novel bias network for a microwave power amplifier, and to methods and circuits for enhancing the average power efficiency and improving the linearity of the Class A microwave power amplifier.

BACKGROUND TO THE INVENTION

Microwave power amplifiers, boosting the radio signal to a sufficient power level for transmission through the air interface from the transmitter to the receiver, are important components in wireless communications systems. They are the circuits that convert DC power into RF/microwave output power and in addition power amplifiers consume a significant amount of power, especially in portable devices. Inherently, the microwave transistors of the power amplifiers are nonlinear. Intermodulation distortion (IMD) is a common problem suffered from high-efficiency amplification since the amplifier is operating within its nonlinear region. Its products cause both in-band distortion and out-of-band emission. To keep the adjacent channel interference tightly within the specification of the systems, backing-off the output power of the amplifier is the simplest solution. However, this results in degradation of efficiency. Therefore, linearity and efficiency are highly desirable objectives of power amplifier designs.

In future wireless communications systems, non-constant envelope modulation schemes, such as M-PSK (Multiple Phase Shift Keying) and QAM (Quadrature Amplitude Modulation), are anticipated to accommodate higher channel capacity and better bandwidth efficiency in wireless transmission. The information is carried in such digital modulations by both amplitude and phase of the RF signals, therefore, highly linear amplification is desirable to meet the stringent requirements on both transmitted spectrum emission and received signal-to-noise ratio. Class A and Class AB power amplifiers are potential candidates, but they suffer the problem of low average power efficiency. Therefore, low distortion and high average power efficiency are the key issues for the next-generation power amplifier design.

In view of compensating the tradeoffs between linearity and efficiency of power amplifiers, various linearizing and bias controlling circuitries have been explored.

System-level linearization techniques, like feedforward, digital predistortion and even-order signals injection, provide excellent suppressions of spectral regrowth. However, these techniques require complicated and expensive circuitry, additional power consumption and large occupation of printed circuit broad area. As a result, only base station applications can benefit from these techniques.

Circuit-level techniques utilize the nonlinear characteristic of microwave diodes or transistors, which compensate for the nonlinear variation of the internal components of the amplifying transistors or distort the signals before or after the amplifying transistors, provide a compact and low-cost approach for the handset applications. Examples of such prior art, utilizing a single microwave diode, are shown in FIG. 1, FIG. 2 and FIG. 3.

The methodology of the approach in FIG. 1 is to compensate for the nonlinear capacitor, typically the base-collector capacitor ($C_{BC}$) of bipolar transistors and the gate-source capacitor ($C_{GS}$) of field-effect transistors for compensating the phase distortion (amplitude modulation to phase modulation distortion) of the amplifier. The methodology utilizes the nonlinear capacitor of a reverse-biased microwave diode (i.e. $V_L$ is positive) to provide a substantially constant of resultant capacitance at the input terminal of the amplifying transistor.

The methodology of the approach in FIG. 2 is to compensate the nonlinear transconductance ($g_m$) of bipolar transistors for compensating the gain compression of the amplifier. A nonlinear rectified current is present when there is RF signal passing through the diode ($Q_L$). Consequently, this rectified current increases with the increase of the input power. As a result, the junction voltage ($V_L$) drops which leads to an increase of the base-emitter voltage ($V_{BE}$) of the amplifying transistor.

The methodology of the approach in FIG. 3 is to distort the input signal with positive gain and negative phase deviations for compensating both the gain compression and phase distortion of the amplifier. A nonlinear rectified current is present when there is RF signal passing through the diode ($Q_L$). Consequently, this rectified current increases with the increase of the input power. As a result, the junction voltage ($V_L$) drops which leads to the increase of the internal resistance of $Q_L$ and the magnitude and the phase of the transfer function from RF input port ($RF_{IN}$) to power amplifier input port ($PA_{IN}$) are increased and decreased, respectively.

Inevitably, the nonlinearity matching between diode linearizers and amplifying transistors is rigid, and hence, the linearity improvement is limited.

SUMMARY OF THE INVENTION

According to the present invention there is provided a microwave power amplifier comprising a bias network located between a radio frequency signal input port and the input port of a microwave transistor, wherein said bias network comprises a baseband part and a microwave part, both said baseband part and said microwave part being connected to a node located between the said radio frequency signal input port and said microwave transistor input port.

In preferred embodiments of the invention the baseband part comprises a forward-biased diode connected to the node via an RF choking inductor, and a decoupling capacitor connected to ground. The baseband part provides a short-circuit termination for low frequency intermodulation products at the input port of the microwave transistor.

The microwave part may comprise a forward-biased diode connected to said node, and a coupling capacitor.

The power amplifier may comprise either a bipolar transistor or a field effect transistor.

When the microwave transistor comprises a bipolar transistor, the bias network provides a substantially constant voltage that stabilizes the base-emitter voltage of the bipolar transistor. Furthermore, the bias network provides an increased base current for the bipolar transistor with increased input power. The increased base current may be provided by a rectified current generated by the forward-biased diode in the microwave part.

In a preferred embodiment of the invention, the microwave transistor comprises a bipolar transistor, and the bias network provides a substantially constant voltage that stabilizes the base-emitter voltage of the bipolar transistor, and an increased base current for the bipolar transistor with increased input power, with the stabilized base-emitter voltage and the increased base current providing an increased collector current with increased power.

When the microwave transistor comprises a field-effect transistor the bias network provides an increased gate-source voltage with increased input power. The increased gate-source voltage may be provided by a rectified current generated by the forward-biased diode in the microwave part. The increased gate-source voltage provides an increased drain current.

In preferred embodiments of the invention the microwave part of the bias network provides predistortion compensation by providing a positive gain deviation and a negative phase deviation to an input RF signal prior to being input to said microwave transistor.

In preferred embodiments of the invention the bias network provides a dynamic third order intermodulation distortion minimum, that the location of the minimum may be controlled by the collector current when the microwave transistor comprises a bipolar transistor or the drain current when the microwave transistor comprises a field-effect transistor

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
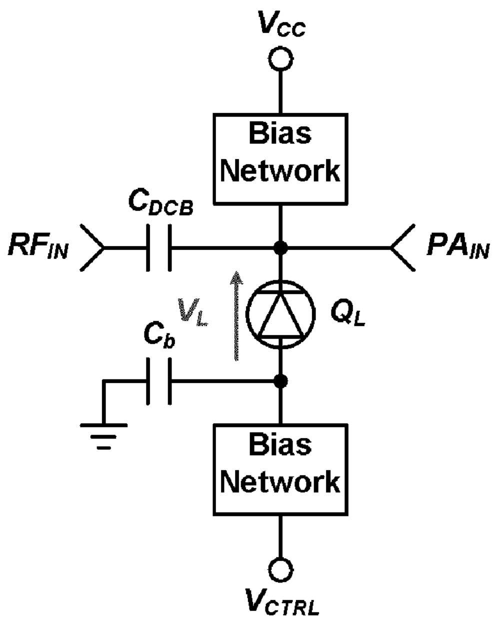
FIG. 1 is a schematic diagram of a first example of the prior art.
Figure 2:
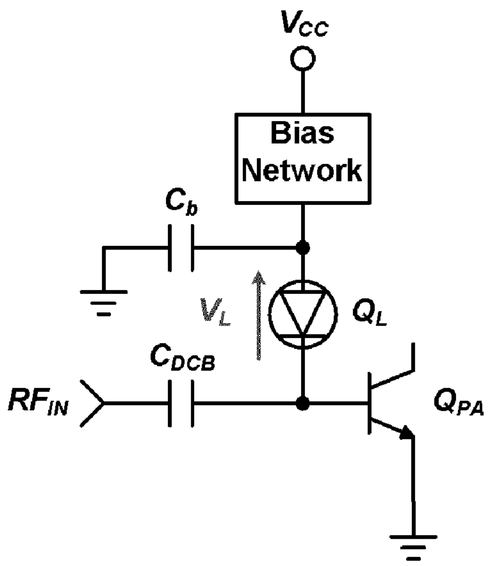
FIG. 2 is a schematic diagram of a second example of the prior art.
Figure 3:
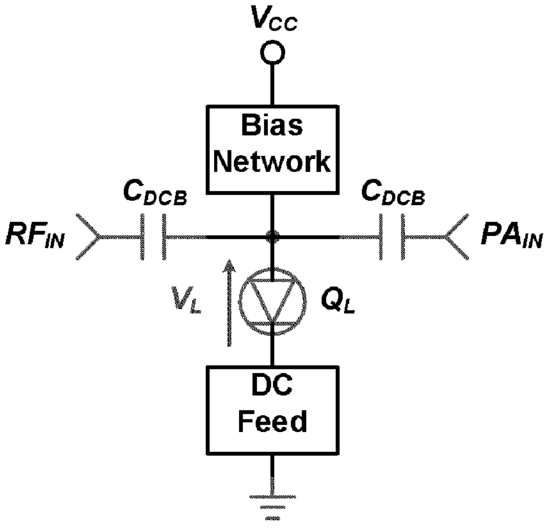
FIG. 3 is a schematic diagram of a third example of the prior art.
Figure 4:
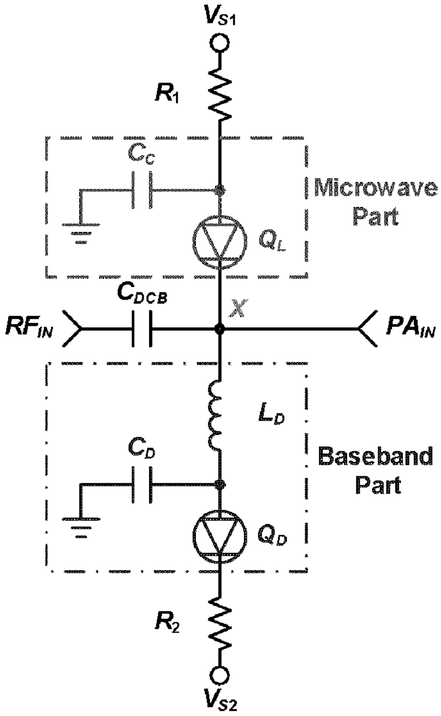
FIG. 4 is a schematic diagram of the general form of an embodiment of the present invention, FIGS. 5(*a*)-(*b*) show two examples of a forward-biased diode being directly connected to the RF path.

FIG. 4 shows the general structure of an embodiment of the self-adaptive bias network. The network is connected at a node located between the port of input RF signal ($RF_{IN}$) and the input port of the microwave transistor ($PA_{IN}$). The network can be divided into two parts: baseband and microwave parts. The baseband part includes an RF choking inductor $L_D$, a decoupling capacitor $C_D$ and a forward-biased diode $Q_D$. $L_D$ is used to isolate the RF signals, bypass low frequency components and provide a DC path to $Q_D$. $C_D$ is used to bypass all AC signals, including the leakage of RF signals and the low frequency intermodulation products, to ground. $Q_D$ acts as a voltage stabilizer and a current source. The microwave part includes a forward-biased diode $Q_L$ and a coupling capacitor $C_C$. $Q_L$ acts as a rectifier and a predistorter. $C_C$ serves to control the coupling effect of the input RF signals to $Q_L$. It should also be understood that the forward-based diodes $Q_D$ and $Q_L$ can be implemented either by microwave diodes or by junction diodes of a microwave transistor (eg the base-emitter junction or base-collector junction of a bipolar transistor).

To complete the review of the components in FIG. 4, $V_{S1}$ and $V_{S2}$ are the DC supply voltage sources for both the self-adaptive bias network and the amplifying transistor, $R_1$ is a bias resistor that provides a path for DC feed but an open circuit for RF signals, $R_2$ is a bias resistor that provides certain bias voltage for $PA_{IN}$, and $C_{DCB}$ is a DC-blocking capacitor that prevents DC signal passing through the RF port.

$L_D$ should have a high inductance or a reactance that is higher than 250Ω at the carrier frequency. $C_D$ should have a high capacitance or a reactance that is lower than 10Ω at the baseband frequency. $R_1$ should have a resistance higher than 250Ω. $Q_D$ can be a low frequency component. $Q_L$ is a microwave diode.

Figure 5:
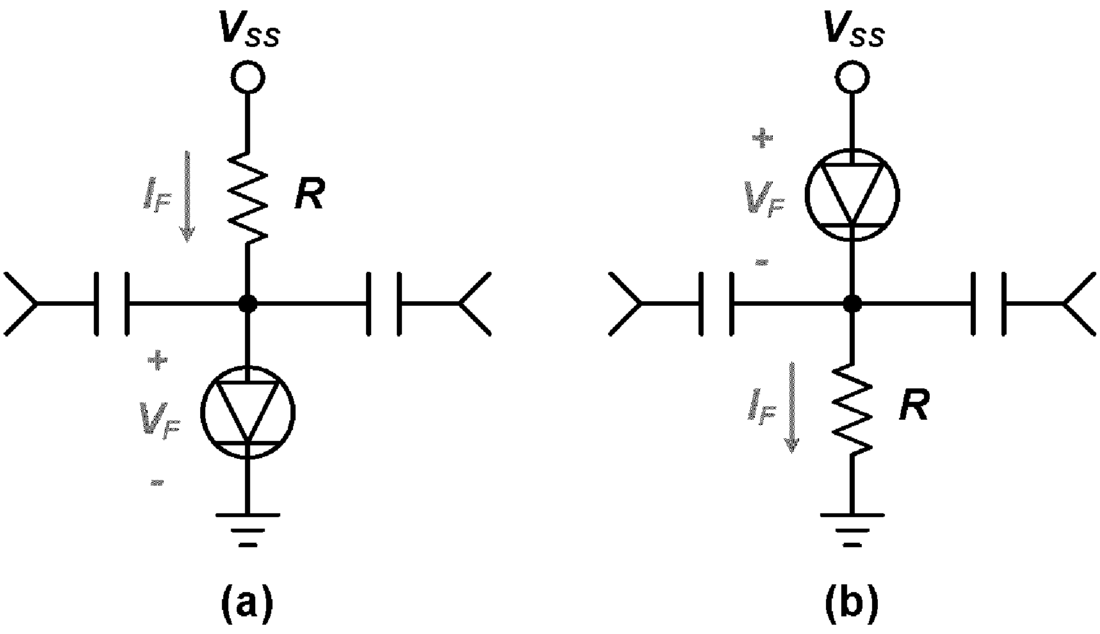
Figure 6:
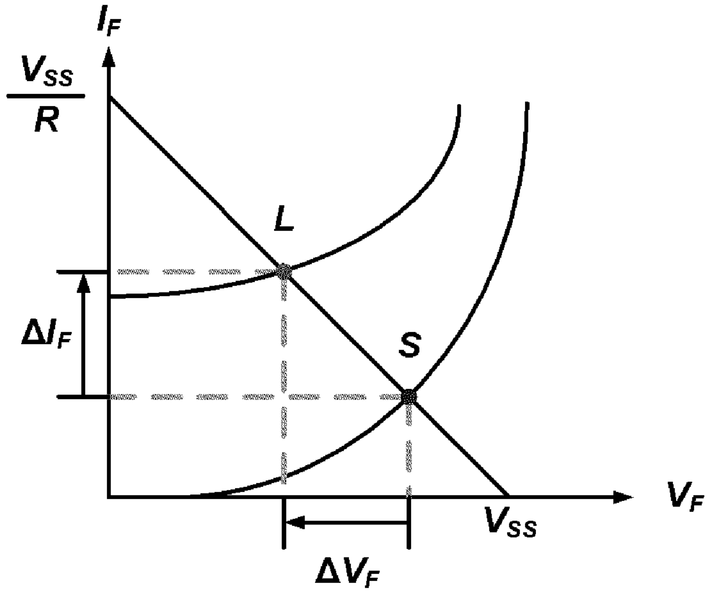
FIG. 6 shows the I-V characteristic curve of a forward-biased diode.

Both $Q_L$ and $Q_D$ operate in the forward-biased region, but the main difference between them is the movement of their quiescent point. When the diode is directly connected to the RF signal path as shown in the configurations of FIG. 5 (*a*) or (*b*), the forward bias current $I_F$ and the forward bias voltage $V_F$ can be expressed as:

$$I_F=I_{F0}+I_{RECT}$$

$$V_F=V_{SS}-I_FR$$

where $I_{F0}$ is the forward bias current at zero RF input, $I_{RECT}$ is the rectified current, $V_{SS}$ is the supply voltage, and R is the bias resistor. When there is no RF signals, $I_{RECT}$ is equal to zero such that $I_F$ is equal to $I_{F0}$, while $I_{RECT}$ increases with the increase of RF power. To further demonstrate the influence of $I_{RECT}$, the movement of the quiescent point is illustrated in I-V characteristic curve as shown FIG. 6. If there is RF signals passing through the diode (the condition of $Q_L$), the quiescent point of the diode moves from the point S to point L as the voltage drop across R increases with the influence of $I_{RECT}$. Or more generally, the presence of $I_{RECT}$ contributes to the delta increase of $I_F$ and the delta drop of $V_F$. When the diode is well-isolated from RF signals (the condition of $Q_D$ in FIG. 4), the quiescent point stays at the point S steadily.

Three objectives of embodiments of the present invention are to provide: (1) adaptive power management, (2) predistortion, and (3) dynamic third-order intermodulation distortion minimum for the power amplifier.

In the case of a power amplifier comprising a bipolar transistor, the self-adaptive bias network serves to (1) stabilize the base-emitter voltage $V_{BE}$, and (2) bias the self-adaptive base current $I_B$ for the self-adaptive collector current $I_C$.

Figure 7:
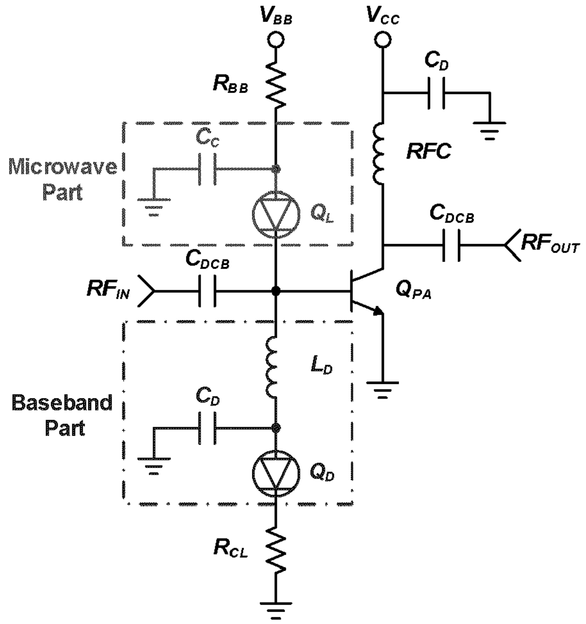
FIG. 7 shows a schematic diagram of a power amplifier topology for a bipolar transistor according to an embodiment of the present invention.

One embodiment of the topology for a bipolar transistor is shown in FIG. 7. The bipolar transistor can be any form of bipolar transistor, for example, a bipolar junction transistor (BJT), or a heterojunction bipolar transistor (HBT). The self-adaptive bias network is connected at a node between the port of the input RF signals ($RF_{IN}$) and the base junction of the bipolar transistor $Q_{PA}$. $V_{BB}$ is the base bias voltage, $R_{BB}$ is the base bias resistor, and $R_{CL}$ is the current-limiting resistor.

Figure 8:
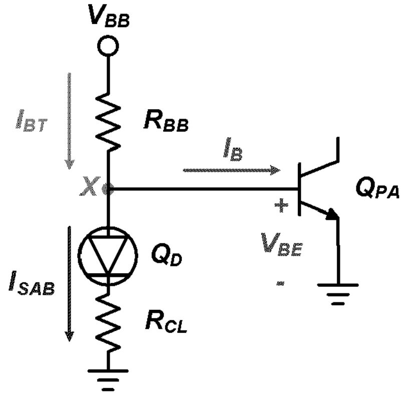
FIG. 8 shows the DC equivalent circuit of FIG. 7 illustrating the stabilization of base-emitter voltage of the bipolar transistor.

The baseband part of the self-adaptive bias network serves to stabilize $V_{BE}$. For simplicity, the microwave part is replaced by a short circuit and the power amplifier is simplified as the DC equivalent circuit as shown in FIG. 8. The voltage at node X $V_X$ and the total base bias current $I_{BT}$ can be expressed as:

$$V_X=V_D+I_{SAB}R_{CL}$$

$$I_{BT}=I_{SAB}+I_B$$

where $V_D$ is the forward bias voltage of $Q_D$, and $I_{SAB}$ is the current passing through $R_{CL}$. It can be seen that $V_{BE}$ is forced to be biased as $V_X$. Since $Q_D$ is well-isolated from RF, by means of the choke $L_D$ (FIG. 7) so $V_D$ remains constant. If $I_{SAB}$ is much higher than $I_B$ such that the rectified current ($I_{RECT}$) generated by base-emitter junction diode of $Q_{PA}$ is comparatively negligible, then $V_{BE}$ only depends on the voltage drop across $R_{CL}$. $Q_D$ acts as a current source, which supplies current for compensating the influence of $I_{RECT}$. If $I_{RECT}$ is comparatively negligible, $I_{SAB}$ drops slightly. Thus, $V_{BE}$ is stabilized as it keeps substantially constant. As a result, the nonlinear effect of the transconductance gain ($g_m$) of the bipolar transistor is compensated, and hence, the DC current gain is stabilized.

Figure 9:
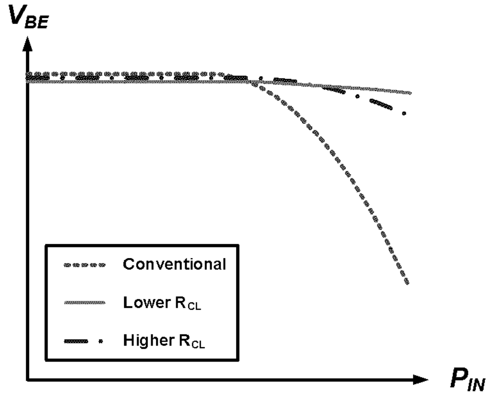
FIG. 9 shows a comparison of the DC bias base-emitter voltage with varying the current-limiting resistance.

The main function of $R_{CL}$ is to limit $I_{SAB}$, and hence, the power consumption of the self-adaptive bias network. Therefore, the effect of $V_{BE}$ stabilization is directly affected by the choice of $R_{CL}$. The comparison of $V_{BE}$ with varying $R_{CL}$ is depicted in FIG. 9. FIG. 9 shows a more stable $V_{BE}$ is provided by a lower $R_{CL}$ with a higher $I_{SAB}$. Moreover, the resultant resistance at node X in FIG. 8 is affected by the resistance of $R_{CL}$. So $V_{BE}$ in the embodiment of the invention is slightly lower than that of the conventional one in low input power region.

Figure 10:
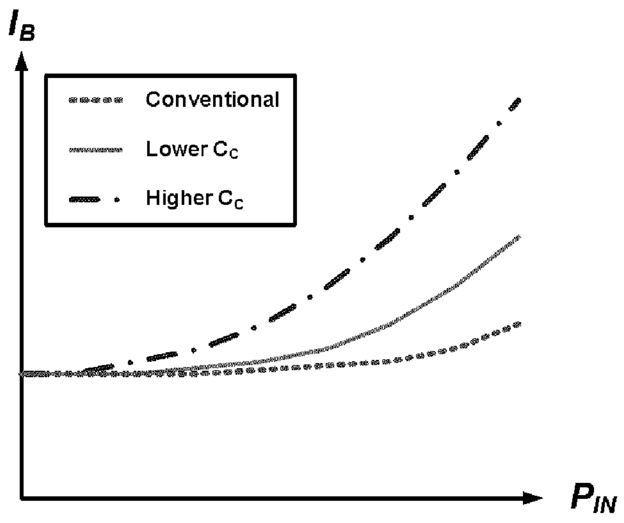
FIG. 10 shows a comparison of the DC bias base current with varying the coupling capacitance.

$I_B$ is self-adaptive as it changes with the input power. However, the self-adaptive $I_B$ is mainly contributed by $I_{RECT}$. Or more generally, it depends on the portion of the input power rectified by the base-emitter junction diode of $Q_{PA}$. The microwave part of the self-adaptive bias network in FIG. 7 serves to control the self-adaptive $I_B$. $I_{RECT}$ is further enhanced when RF signals pass through $Q_L$. Since $C_C$ of the invention is in the order of $10^{-12}$, which is comparatively lower than the junction capacitance of $Q_L$, then the overall capacitance is dominated by $C_C$ as they are in series connection. The main purpose of $C_C$ is to control the coupling of the input signals from $RF_{IN}$ to $Q_L$. To study the effect of $C_C$ on the self-adaptive $I_B$, the comparison of $I_B$ with varying $C_C$ is depicted in FIG. 10. FIG. 10 shows that a greater increase of $I_B$ is achieved by a higher $C_C$ as it provides lower impedance for more RF power couples to $Q_L$.

With DC current gain stabilized self-adaptive $I_B$ is biased by the self-adaptive bias network, and $I_C$ is self-adaptive as it is equal to the product of $I_B$ and DC current gain.

When the power amplifier comprises a field-effect transistor, the self-adaptive bias network serves to bias the self-adaptive gain-source voltage $V_{GS}$ for the self-adaptive drain current $I_D$.

Figure 11:
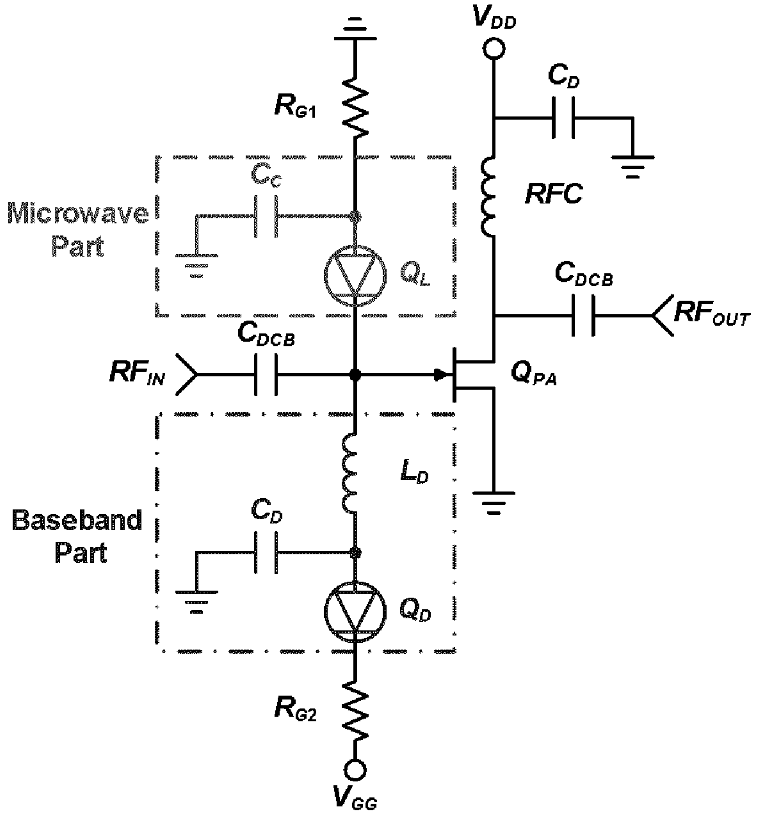
FIG. 11 shows a schematic diagram of a power amplifier topology for a field-effect transistor according to an embodiment of the present invention.

One possible configuration of the topology for the field-effect transistor is shown in FIG. 11. The field-effect transistor can be any form of field-effect transistor, for example, a junction field-effect transistor (JFET), a metal-oxide-semiconductor field-effect transistor (MOSFET), a metal-semiconductor field-effect transistor (MESFET), laterally diffused metal-oxide-semiconductor field-effect transistor (LDMOS), or a high electron mobility transistor (HEMT). The self-adaptive bias network is connected at a node between the port of the input RF signals ($RF_{IN}$) and the gate junction of the field-effect transistor $Q_{PA}$. $V_{GG}$ is the gate bias voltage, $R_{G1}$ and $R_{G2}$ are the gate bias resistors.

Figure 12:
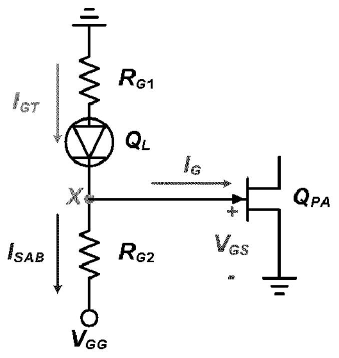
FIG. 12 shows the DC equivalent circuit of FIG. 11 illustrating the self-adaptive gate-source voltage biasing of the field-effect transistor.

The microwave part of the self-adaptive bias network serves to bias the self-adaptive $V_{GS}$. For simplicity, the baseband part can be replaced by a short circuit and then the power amplifier is simplified as the DC equivalent circuit shown in FIG. 12. The voltage at node X $V_X$ and the total gate bias current $I_{GT}$ can be expressed as:

$$V_X=-(V_L+I_{GT}R_{G1})=I_{SAB}R_{G2}+V_{GG}$$

$$I_{GT}=I_{SAB}+I_G$$

where $V_L$ is the voltage drop across $Q_L$, $I_{SAB}$ is the current passing through $R_{G2}$, and $I_G$ is the gate current. In general, $I_G$ is nearly equal to zero. It can be seen that $V_{GS}$ is forced to be biased as $V_X$, which is directly affected by $I_{SAB}$. Similarly, $Q_L$ provides $I_{RECT}$ such that $I_{SAB}$ and $V_X$ increase with the increase of input power.

$Q_D$ of the baseband part of the self-adaptive bias network provides a voltage drop such that $R_{G2}$ can be realized with a smaller resistance. The combination of $R_{G1}$ and $R_{G2}$ is a voltage divider. Since $R_{G1}$ is higher than 250Ω for providing an open-circuit for RF signals, $R_{G2}$ should not be too low for a reasonable $V_{GG}$ if $Q_D$ is absent.

Figure 13:
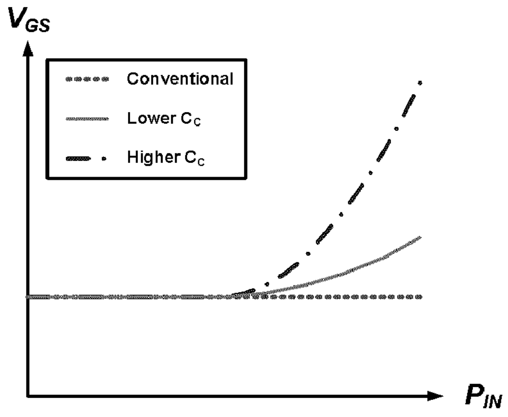
FIG. 13 shows a comparison of the DC bias gain-source voltage with varying the coupling capacitance.

$V_{GS}$ is self-adaptive as it changes with the input power. However, the self-adaptive $V_{GS}$ is mainly contributed by $I_{RECT}$. Since $C_C$ of the invention is in the order of $10^{-12}$, which is comparatively lower than the junction capacitance of $Q_L$, then the overall capacitance is dominated by it as they are in series connection. The main purpose of $C_C$ is to control the coupling of the input signals from $RF_{IN}$ to $Q_L$. To study the effect of $C_C$ on the self-adaptive $V_{GS}$, the comparison of $V_{GS}$ with varying $C_C$ is depicted in FIG. 13. This shows that a greater increase of $V_{GS}$ is achieved by a higher $C_C$ as it provides lower impedance as more RF power couples to $Q_L$.

Though the transconductance gain ($g_m$) of the field-effect transistor is decreased with the increase of input power, the increase of $V_{GS}$ is more significant. With self-adaptive $V_{GS}$ biased by the self-adaptive bias network, $I_D$ is self-adaptive as it is equal to the product of $V_{GS}$ and $g_m$.

The DC power consumption of the amplifying transistor is equal to the product of DC bias voltage (collector-emitter voltage for bipolar transistor and drain-source voltage for field-effect transistor) and DC bias current ($I_C$ for bipolar transistor and $I_D$ for field-effect transistor). In general, the bias voltage always remains unchanged. The topologies described bias a self-adaptive current such that a lower current is supplied for amplifying a lower input power while the power handling is increased with a higher current for larger input signals. This phenomenon is regarded as an adaptive management that enhances the average power efficiency of the power amplifier.

Figure 14:
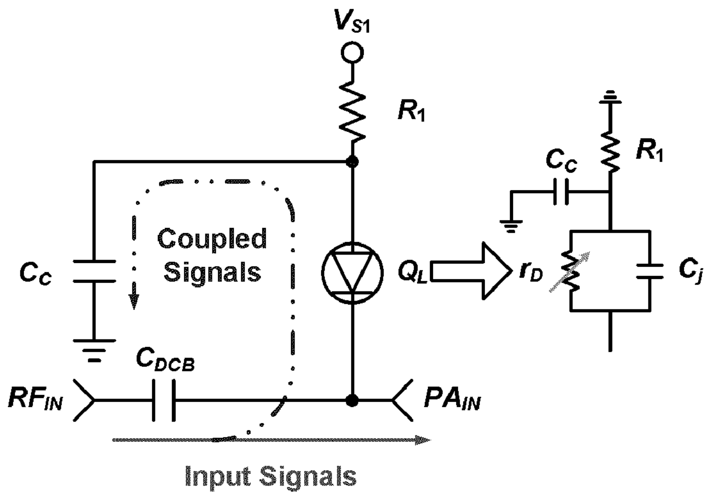
FIG. 14 shows an equivalent circuit of an embodiment of the present invention operating as a predistorter.

The microwave part of the topologies described distorts the input signals with positive gain and negative phase deviation. Since the baseband part is well-isolated from RF signals, the topology can be simplified to the equivalent circuit of a predistorter shown in FIG. 14. $Q_L$ may in turn be modeled as a junction capacitor $C_j$ in parallel with a dynamic resistor $r_D$.

Then, the admittance of the predistorter $Y_{PD}$ can be expressed as:

$$Y_{PD} = \left[\left(r_D \,//\, \frac{1}{j\omega C_j}\right) + \left(R_1 \,//\, \frac{1}{j\omega C_C}\right)\right]^{-1} = \left(\frac{r_D}{1 + j\omega r_D C_j} + \frac{R_1}{1 + j\omega R_1 C_C}\right)^{-1} = \frac{(1 - \omega^2 r_D R_1 C_j C_C) + j\omega(r_D C_j + R_1 C_C)}{(r_D + R_1) + j\omega r_D R_1 (C_j + C_C)} = \frac{\left(\frac{1}{r_D} - \omega^2 R_1 C_j C_C\right) + j\omega\left(C_j + \frac{R_1 C_C}{r_D}\right)}{\left(1 + \frac{R_1}{r_D}\right) + j\omega R_1 (C_j + C_C)}$$

In general, the reactances of $C_j$ and $C_C$ are in the order of $10^0$ for the operating frequency while $R_1$ is higher than 250Ω. Therefore, $Y_{PD}$ can be approximated to:

$$Y_{PD} \approx \frac{-\omega^2 R_1 C_j C_C + j\omega\left(C_j + \frac{R_1 C_C}{r_D}\right)}{j\omega R_1 (C_j + C_C)} = \frac{\left(\frac{C_j}{R_1} + \frac{C_C}{r_D}\right) + j\omega C_j C_C}{C_j + C_C}$$

Let $RF_{IN}$ and $PA_{IN}$ be port 1 and 2 respectively. For simplicity, the port impedance is assumed to be $Z_0$. The transmission coefficient from port 1 to port 2, $S_{21}$ can be expressed as:

$$S_{21} = \frac{2}{2 + Z_0 Y_{PD}} = \frac{2(C_j + C_C)}{2(C_j + C_C) + Z_0\left[\left(\frac{C_j}{R_1} + \frac{C_C}{r_D}\right) + j\omega C_j C_C\right]} = \frac{2(C_j + C_C)}{Z_0\left(\frac{2(C_j + C_C)}{Z_0} + \frac{C_j}{R_1} + \frac{C_C}{r_D}\right) + j\omega Z_0 C_j C_C}$$

$$|S_{21}| = \frac{2(C_j + C_C)}{Z_0\sqrt{\left(\frac{2(C_j + C_C)}{Z_0} + \frac{C_j}{R_1} + \frac{C_C}{r_D}\right)^2 + \omega^2 C_j^2 C_C^2}}$$

$$\angle S_{21} = -\tan^{-1}\left(\frac{\omega C_j C_C}{\frac{2(C_j + C_C)}{Z_0} + \frac{C_j}{R_1} + \frac{C_C}{r_D}}\right)$$

where $|S_{21}|$ is the magnitude and $\angle S_{21}$ is the phase of $S_{21}$. From the diode equation, $r_D$ can be expressed as:

$$r_D = \left(\frac{\partial I_L}{\partial V_L}\right)^{-1} = \frac{kT}{qI_S} e^{-\frac{q}{kT} V_L}$$

where $I_L$ is the forward bias current and $V_L$ is the forward bias voltage of $Q_L$, kT/q is the thermal voltage (k is the Boltzmann constant, T is the temperature, and q is the electronic charge), and $I_S$ is the saturation current. Since input signals are partially coupled to $Q_L$, $V_L$ decreases with the influence of $I_{RECT}$. Thus, $r_D$ is increased with the increase of input power. As a result, $|S_{21}|$ is increased to provide a positive gain and $\angle S_{21}$ is decreased to perform a negative phase deviation to the input signals. Since $Y_{PD}$, $S_{21}$ and $\angle S_{21}$ are the functions of $C_C$, $C_C$ is to control the effect of coupling as well as the maximum deviation of both gain expansion and negative phase distortion.

In the conventional power amplifiers, gain is compressed by the decrease of the transconductance gain and phase is distorted by the variation of the nonlinear capacitor when the amplifying transistor operates over its load line. The linearity of the input-output characteristic of the power amplifier is improved by the predistortion provided by the described topologies.

The combination of $L_D$ and $C_D$ provides a baseband short-circuit for the existence of the third-order intermodulation distortion (IMD3) minimum (proven in N. B De Carvalho and J. C. Pedro, "Large- and small-signal IMD behavior of microwave power amplifiers" IEEE Trans. Microwave Theory Tech., Vol. 47, No. 12, pp. 2364-2374, December 1999, which is hereby incorporated by reference herein in its entirety). Assuming the power amplifier is a weakly nonlinear device, by using the Volterra series with Taylor expansion, the output RF current $i_{OUT}(t)$ can be expressed as $$i_{OUT}(t) = \frac{1}{2}H_1 \sum_{q=-Q}^{Q} V_q e^{j\omega_q t} + \frac{1}{4}H_2 \sum_{q_1=-Q}^{Q}\sum_{q_2=-Q}^{Q} V_{q_1} V_{q_2} e^{j(\omega_{q_1} + \omega_{q_2})t} + \frac{1}{8}H_3 \sum_{q_1=-Q}^{Q}\sum_{q_2=-Q}^{Q}\sum_{q_3=-Q}^{Q} V_{q_1} V_{q_2} V_{q_3} e^{j(\omega_{q_1} + \omega_{q_2} + \omega_{q_3})t} + \frac{1}{16}H_4 \sum_{q_1=-Q}^{Q}\sum_{q_2=-Q}^{Q}\sum_{q_3=-Q}^{Q}\sum_{q_4=-Q}^{Q} V_{q_1} V_{q_2} V_{q_3} V_{q_4} e^{j(\omega_{q_1} + \omega_{q_2} + \omega_{q_3} + \omega_{q_4})} + \frac{1}{32}H_5 \sum_{q_1=-Q}^{Q}\sum_{q_2=-Q}^{Q}\sum_{q_3=-Q}^{Q}\sum_{q_4=-Q}^{Q}\sum_{q_5=-Q}^{Q} V_{q_1} V_{q_2} V_{q_3} V_{q_4} V_{q_5} e^{j(\omega_{q_1} + \omega_{q_2} + \omega_{q_3} + \omega_4 + \omega_5)t} + \ldots$$

With two sinusoidal input signals, the input voltage can be expressed as $$v_{IN}(t) = A[\cos(\omega_1 t + \theta_1) + \cos(\omega_2 t + \theta_2)] = \frac{A}{2}[e^{-j(\omega_1 t + \theta_1)} + e^{j(\omega_1 t + \theta_1)} + e^{-j(\omega_2 t + \theta_2)} + e^{j(\omega_2 t + \theta_2)}]$$

When analyzed practically up to the fifth-order terms, IMD3 can be expressed as $$i_{OUT}(2\omega_2 - \omega_1) = \frac{3A^3}{8} H_3(\omega_2, \omega_2, -\omega_1) e^{j[(2\omega_2 - \omega_1)t + (2\theta_2 - \theta_1)]} + \frac{50A^5}{32} H_5(\omega_2, \omega_2, -\omega_1, \omega, \omega) e^{j[(2\omega_2 - \omega_1)t + (2\theta_2 - \theta_1)]}$$

If $H_3(\bullet)$ and $H_5(\bullet)$ are 180° out of phase, an IMD3 minimum exists.

Figure 15:
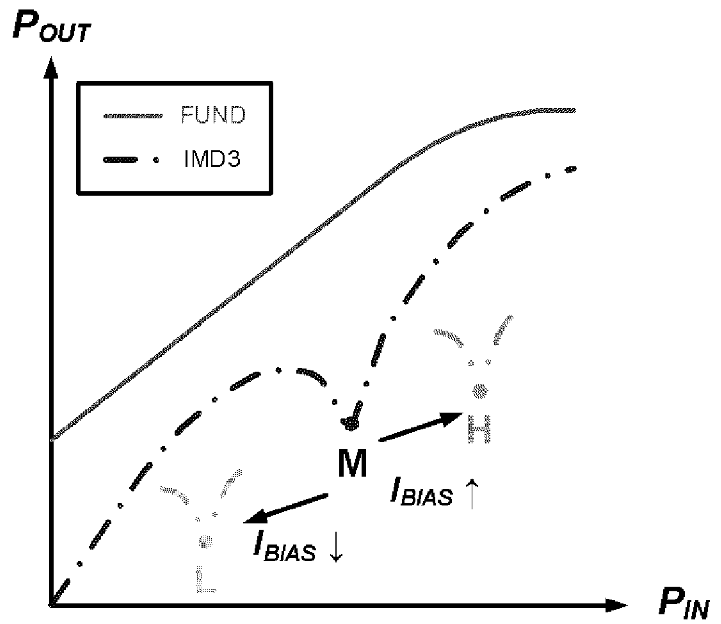
FIG. 15 shows the movement of the IMD3 minimum.

The topologies described provide a dynamic IMD3 minimum. $H_i(\bullet)$ is a function of source/load impedances of the matching networks as well as the nonlinear internal components of the amplifying transistor which depend on the quiescent point. Then, the IMD3 minimum can be tuned by any combination of them such that $H_3(\bullet)$ and $H_5(\bullet)$ are 180° out of phase. The topologies described provide a baseband short-circuit and tune the IMD3 minimum dynamically by the self-adaptive bias current while the source/load impedances and bias voltage are kept constant. To further demonstrate the idea of dynamic IMD3 minimum, the movement of the IMD3 minimum is illustrated in FIG. 15. If a lower current is biased, the IMD3 minimum moves from point M to point L. In contrast, while if a higher current is biased, the IMD3 minimum move to point H. Therefore, IMD3 minimum dynamic as the self-adaptive bias current changes with input power.

Figure 16:
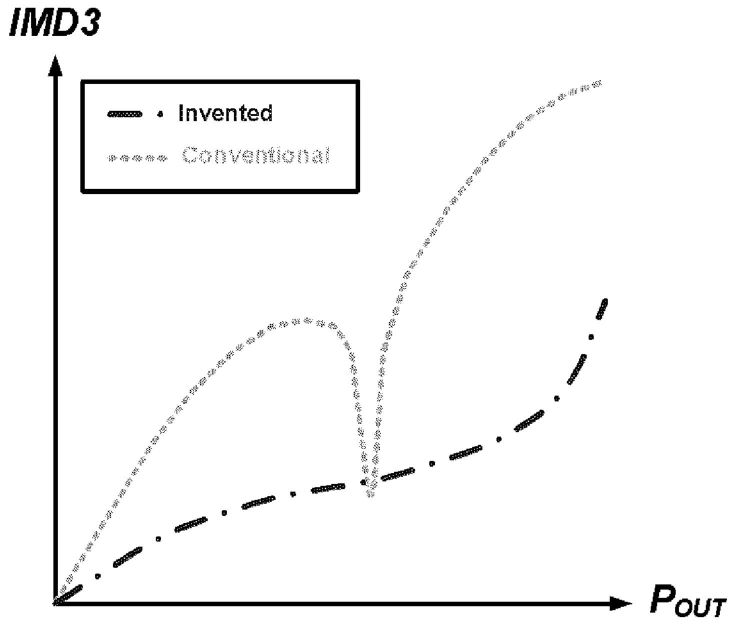
FIG. 16 shows a comparison of the IMD3 minimum between a conventional amplifier and an embodiment of the present invention.

Intermodulation distortion is a common problem when the power amplifiers are operated within the nonlinear region. Though IMD3 minimum can exist in the conventional power amplifiers, it is too narrow that only covers few dB range of the output power. Therefore, the dynamic IMD3 minimum technique serves to reduce the adjacent channel power (the power of IMD3 when the power amplifier is under two-tone test) for a wider dynamic range as shown in FIG. 16. As a result, the output power can be further utilized with the adjacent channel power is still kept below the required specification of the mobile systems.

The invention claimed is:

1. A microwave power amplifier comprising a bias network located between a radio frequency signal input port and the input port of a microwave transistor, wherein said bias network comprises a baseband part and a microwave part separate from the baseband part, both said baseband part and said microwave part being connected to a node located between the said radio frequency signal input port and said microwave transistor input port, wherein said baseband part comprises a forward-biased diode connected to said node via an RF choking inductor, and a decoupling capacitor connected to ground, and wherein said bias network provides a DC path between said forward biased diode and said microwave transistor input port.

2. An amplifier as claimed in claim 1, wherein the microwave part comprises a forward-biased diode connected to said node, and a coupling capacitor.

3. An amplifier as claimed in claim 1, wherein said baseband part provides a short-circuit termination for the low frequency intermodulation products at the input port of the microwave transistor.

4. An amplifier as claimed in claim 1, wherein said microwave transistor comprises either a bipolar transistor or a field effect transistor.

5. An amplifier as claimed in claim 1, wherein said microwave transistor comprises a bipolar transistor and wherein said bias network provides a substantially constant voltage that stabilizes the base-emitter voltage of the bipolar transistor.

6. An amplifier as claimed in claim 2, wherein said microwave transistor comprises a bipolar transistor and wherein said bias network provides an increased base current for the bipolar transistor with increased input power.

7. An amplifier as claimed in claim 6 wherein said increased base current is provided by a rectified current generated by the base-emitter junction diode of the bipolar transistor and further enhanced by a rectified current generated by the forward-biased diode in the microwave part.

8. An amplifier as claimed in claim 1, wherein said microwave transistor comprises a bipolar transistor, wherein said bias network provides a substantially constant voltage that stabilizes the base-emitter voltage of the bipolar transistor, and said bias network provides an increased base current for the bipolar transistor with increased input power, and wherein said stabilized base-emitter voltage and said increased base current provide an increased collector current with increased power.

9. An amplifier as claimed in claim 2, wherein said microwave transistor comprises a field-effect transistor and said bias network provides an increased gate-source voltage with increased input power.

10. An amplifier as claimed in claim 9 wherein the increased gate-source voltage is provided by a rectified current generated by the forward-biased diode in the microwave part.

11. An amplifier as claimed in claim 9, wherein the increased gate-source voltage provides an increased drain current.

12. An amplifier as claimed in claim 1, wherein the microwave part of said bias network provides predistortion compensation by providing a positive gain deviation and a negative phase deviation to an RF signal prior to being input to said microwave transistor.

13. An amplifier as claimed in claim 1, wherein said bias network provides a dynamic third order intermodulation distortion minimum.

14. An amplifier as claimed in claim 13, wherein the location of the third order intermodulation distortion minimum is controlled by the collector current when said microwave transistor comprises a bipolar transistor or the drain current when said microwave transistor comprises a field-effect transistor.

15. A microwave power amplifier comprising a bias network located between a radio frequency signal input port and the input port of a microwave transistor, wherein said bias network comprises a baseband part and a microwave part, both said baseband part and said microwave part being directly connected to a node located between the said radio frequency signal input port and said microwave transistor input port, wherein said bias network provides a dynamic third order intermodulation distortion minimum.

16. An amplifier as claimed in claim 15 wherein a location of the third order intermodulation distortion minimum is controlled by the change of collector current when said microwave transistor comprises a bipolar transistor or the drain current when said microwave transistor comprises a field-effect transistor.

17. A microwave power amplifier comprising a bias network located between a radio frequency signal input port and the input port of a microwave transistor, wherein said bias network comprises a baseband part and a microwave part separate from the baseband part, both said baseband part and said microwave part being connected to a node located between the said radio frequency signal input port and said microwave transistor input port, wherein the microwave part comprises a forward-biased diode connected to said node, and a coupling capacitor, and wherein said bias network provides a DC path between said forward biased diode and said microwave transistor input port.

18. A microwave power amplifier comprising a bias network located between a radio frequency signal input port and the input port of a microwave transistor, wherein said bias network comprises a baseband part and a microwave part, both said baseband part and said microwave part being directly connected to a node located between the said radio frequency signal input port and said microwave transistor input port, and wherein said baseband part provides a short-circuit termination for the low frequency intermodulation products at the input port of the microwave transistor.

19. A microwave power amplifier comprising a bias network located between a radio frequency signal input port and the input port of a microwave transistor, wherein said bias network comprises a baseband part and a microwave part, both said baseband part and said microwave part being connected to a node located between the said radio frequency signal input port and said microwave transistor input port, wherein the microwave part of said bias network provides predistortion compensation by providing a positive gain deviation and a negative phase deviation to an RF signal prior to being input to said microwave transistor.

* * * * *